United States Patent
Stilgenbauer et al.

(10) Patent No.: US 11,804,814 B1
(45) Date of Patent: Oct. 31, 2023

(54) NOISE SHAPER FADER

(71) Applicant: STMicroelectronics S.r.l., Agrate Brianza (IT)

(72) Inventors: Francesco Stilgenbauer, Rho (IT); Paolo Cacciagrano, Cairate (IT); Giovanni Gonano, Padua (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/719,613

(22) Filed: Apr. 13, 2022

(51) Int. Cl.
   *H03G 3/34* (2006.01)
   *H04R 3/00* (2006.01)

(52) U.S. Cl.
   CPC ........... *H03G 3/344* (2013.01); *H04R 3/00* (2013.01); *H03G 2201/103* (2013.01); *H04R 2430/01* (2013.01)

(58) Field of Classification Search
   CPC .... H03F 3/187; H03F 2200/03; H03F 1/0277; H03F 3/72; H03G 3/34; H03G 3/348; H03G 1/0088; H03G 3/344; H03G 2201/103; H04R 3/00; H04R 2430/01; H04R 3/007
   USPC ........................................... 381/94.5; 330/51
   See application file for complete search history.

(56) References Cited

U.S. PATENT DOCUMENTS

| | | | |
|---|---|---|---|
| 6,204,789 B1 | 3/2001 | Nagata | |
| 8,659,351 B2* | 2/2014 | Gonano | H03F 3/217 330/10 |
| 9,231,535 B2* | 1/2016 | Du | H03F 3/2171 |
| 9,673,762 B2* | 6/2017 | Zhang | H03F 1/0205 |
| 2004/0017854 A1 | 1/2004 | Hansen et al. | |
| 2005/0083115 A1* | 4/2005 | Risbo | H03F 3/217 330/10 |
| 2006/0044166 A1 | 3/2006 | Pfister et al. | |
| 2007/0005160 A1 | 1/2007 | Zaucha et al. | |
| 2008/0042746 A1 | 2/2008 | Kozak et al. | |
| 2009/0102550 A1* | 4/2009 | Ohama | H03F 1/305 330/10 |

(Continued)

FOREIGN PATENT DOCUMENTS

WO          9615484 A2     5/1996

OTHER PUBLICATIONS

Kim, Jaewook, et al.: "Analysis and Design of Voltage-Controlled Oscillator Based Analog-to-Digital Converter," IEEE Transactions on Circuits and Systems—I: Regular Papers, vol. 57, No. 1, Jan. 2010, 13 pgs.

(Continued)

*Primary Examiner* — Xu Mei
(74) *Attorney, Agent, or Firm* — CROWE & DUNLEVY (57) ABSTRACT

A digital audio playback circuit includes a noise shaping circuit configured to receive an input digital audio signal, and a digital to analog converter (DAC) configured to convert the input digital audio signal to a pre-amplified output analog audio signal according to a gain ramp defined by a gain control signal. A muting circuit is configured to compare input digital audio signal to a threshold and assert a mute control signal when the input digital audio signal is below the threshold. An analog gain control ramp circuit is configured to generate the gain control signal in response to the mute control signal to cause the gain ramp to ramp down. An amplifier is configured to amplify the pre-amplified output analog audio signal for playback by an audio playback device.

20 Claims, 4 Drawing Sheets

(56) References Cited

U.S. PATENT DOCUMENTS

| | | |
|---|---|---|
| 2009/0238379 A1 | 9/2009 | Feng |
| 2011/0025538 A1 | 2/2011 | Chiang |
| 2015/0263686 A1 | 9/2015 | Lesso |
| 2020/0366258 A1* | 11/2020 | Wike ...................... H03F 3/245 |

OTHER PUBLICATIONS

Texas Instruments: "TAS5727 25-W Digital Audio Power Amplifier With EQ and DRC," Revised Dec. 2016, 71 pgs.
EP Search Report and Written Opinion for counterpart EP Appl. No. 23164021.0, report dated Aug. 15, 2023, 11 pgs.

* cited by examiner

NOISE SHAPER FADER

TECHNICAL FIELD

This disclosure is related to the field of digital audio playback and, more particularly, to a digital audio playback circuit providing for the reduction or elimination of pop upon muting.

BACKGROUND

In the context of digital sound, noise-shaping is a technique that can be used in conjunction with audio dithering to compensate for bit-depth reduction of an input digital signal. Noise shaping works by raising the frequency range of the rounding error of a digital audio signal after dithering, putting it into a range where human hearing is less sensitive.

In the context of a digital audio output path, consider the case where noise shaping is performed on a digital audio recording together with digital to analog conversion and playback for listening by a human ear. As stated, the noise shaping is raising the frequency range of the rounding error after dithering, pushing it into a range where human hearing is less sensitive. If the noise shaping were to abruptly cease, the frequency range of the rounding error after dithering would return back into a range where human hearing is more sensitive. This could result in an unpleasant transient audio phenomenon, referred to as a "pop", being heard by the human ear. See, for example, FIG. 1. Between times T0 and T1, the level remains at three, and signal after noise shaping (shown as o_prefilt) randomly oscillates about an amplitude of zero. Low-pass filtering is performed, resulting in the filtered output signal shown as o_filt. At time T1, the level changes from 3 to 4, and the noise shaping abruptly ceases. Referring to the o_prefilt signal, at time T1, the amplitude will likely not be at zero. As a result, the filtered output signal o_filt experiences an abrupt drop in amplitude which will be heard by the human ear as a pop.

Figure 1:
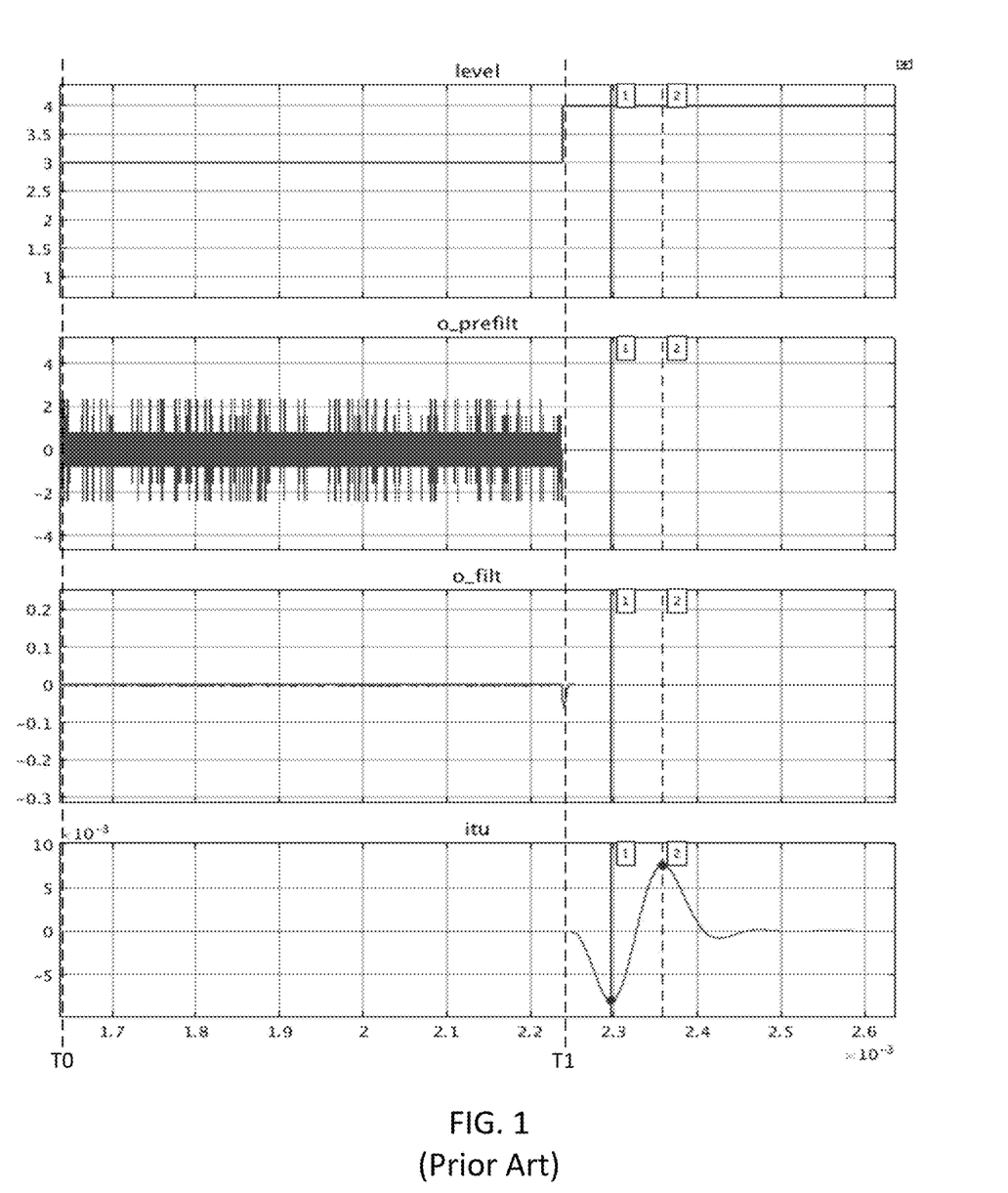
FIG. 1 is a graph showing the issue of pop in prior art digital audio playback circuits when noise shaping is ceased.

It is a common practice in the industry to characterize pop signals driving electroacoustic speakers, by connecting the amplifier driving the electroacoustic speakers to a 4 ohm resistor and processing its signal in parallel with ITU-R ARM filter, the output of which highlights discontinuities present, converting it to a pulse. The max amplitude of this pulse is almost proportional to the pop heard when the amplifier is connected to a reference typical speaker. A threshold of 7.5 mV out of ITU-R ARM is considered the max acceptable level for pop. Referring to FIG. 1, a transient representing a pop begins at time T1.

One way to address this is found in U.S. Pat. No. 7,346,113 (incorporated by reference), which describes checking the memory internal to a noise shaper for an occurrence where the amplitude of the digital audio recording is sufficiently low, and then ceasing noise shaping at that occurrence. The drawback with this is that the time to wait to digitally turn off the noise shaper upon receiving a command to do so is not deterministic.

As such, further development is needed, as it would be advantageous and desirable to provide a circuit and method that can stop a noise-shaped signal with a minimum of inband noise (pop) related to the transition.

SUMMARY

Disclosed herein is a digital audio playback circuit, including a noise shaping circuit configured to receive an input digital audio signal, a digital to analog converter (DAC) configured to convert the input digital audio signal to a pre-amplified output analog audio signal according to a gain ramp defined by a gain control signal, a muting circuit configured to compare input digital audio signal to a threshold and assert a mute control signal when the input digital audio signal is below the threshold, an analog gain control ramp circuit configured to generate the gain control signal in response to the mute control signal to cause the gain ramp to ramp down, and an amplifier configured to amplify the pre-amplified output analog audio signal for playback by an audio playback device.

The ramping down of the gain ramp by the analog gain control ramp circuit may yield a pre-determined turn-off time. The analog gain control ramp circuit may be further configured to generate the gain control signal in response to deassertion of the mute control signal to cause the gain ramp to ramp upwardly. Use of the DAC to convert the input digital audio signal to the pre-amplified output analog audio signal may permit continued operation of the noise shaping circuit when the mute control signal is asserted.

The analog gain control ramp circuit may include a transistor having a control terminal, a capacitor coupled between the control terminal of the transistor and ground, a current source selectively coupled to the control terminal of the transistor by a first switch in response to assertion of the mute control signal, a current sink selectively coupled to the control terminal of the transistor by a second switch in response to deassertion of the mute control signal, and a current subtractor configured to receive a fixed current and to subtract a mute current sunk by the transistor from the fixed current, based upon a voltage across the capacitor, to produce the gain control signal. The current source may charge the capacitor when the first switch is closed, and wherein the current sink discharges the capacitor when the second switch is closed.

The DAC may be a current steering DAC that selectively connects or disconnects current sources and current sinks to differential outputs in response to the input digital audio signal, the current sources and current sinks being referenced to the gain control signal.

The amplifier may be a class-D amplifier.

The muting circuit may include a comparator configured to compare the input digital audio signal to the threshold and to assert the mute control signal when the input digital audio signal is below the threshold.

The muting circuit may include a comparator configured to compare the input digital audio signal to the threshold and to assert its output when the input digital audio signal is below the threshold, and a deglitch circuit configured to assert the mute control signal when the output of the comparator is asserted for at least a first threshold period of time, and to deassert the mute control signal when the output of the comparator is deasserted for at least a second threshold period of time.

The input digital audio signal may have been dithered and/or interpolated prior to receipt by the noise shaping circuit.

Also disclosed herein is a method of digital audio playback circuit. The methos may include receiving an input digital audio signal, performing noise shaping on the input digital audio signal, converting the input digital audio signal to a pre-amplified output analog audio signal according to a gain ramp defined by a gain control signal, comparing the input digital audio signal to a threshold and asserting a mute control signal when the input digital audio signal is below the threshold, generating the gain control signal in response to the mut control signal to cause the gain ramp to ramp down, and amplifying the pre-amplified output analog audio signal for playback by an audio playback device.

Comparing the input digital audio signal to a threshold and asserting the mute control signal when the input digital audio signal is below the threshold is performed by comparing the input digital audio signal to the threshold and asserting a comparator output when the digital audio signal is below the threshold, and asserting the mute control signal when the output of the comparator is asserted for at least a first threshold period of time, and deasserting the mute control signal when the output of the comparator is deasserted for at least a second threshold period of time.

The input digital audio signal may have been dithered and/or interpolated prior to receipt by the noise shaping circuit.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown but is to be accorded the widest scope consistent with the principles and features disclosed or suggested herein. Do note that in the below description, any described resistor or resistance is a discrete device unless the contrary is stated and is not simply an electrical lead between two points. Thus, any described resistor or resistance coupled between two points has a greater resistance than a lead between those two points would have, and such resistor or resistance cannot be interpreted to be a lead. Similarly, any described capacitor or capacitance is a discrete device unless the contrary is stated and is not a parasitic unless the contrary is stated. Moreover, any described inductor or inductance is a discrete device unless the contrary is stated and is not a parasitic unless the contrary is stated.

Figure 2:
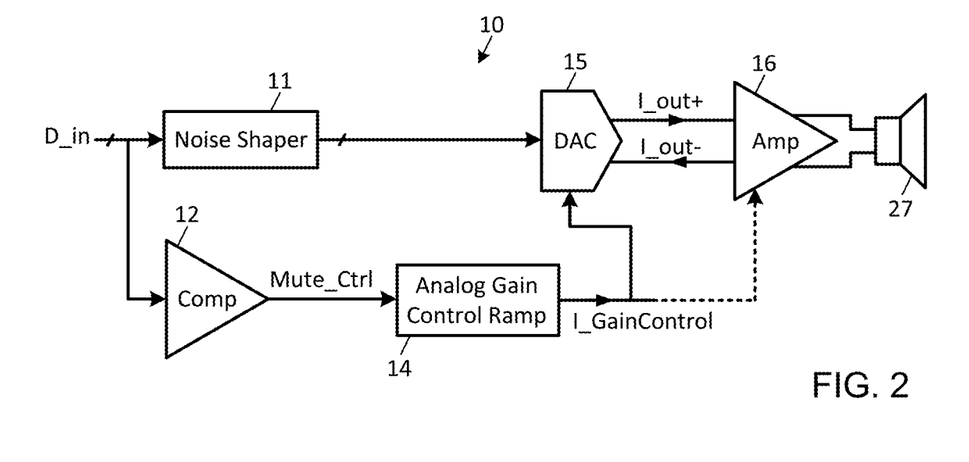
FIG. 2 is a block diagram of a digital audio playback circuit described herein in which pop is reduced or eliminated.

Now described with reference to FIG. 2 is a digital audio playback circuit 10. The digital audio playback circuit 10 receives an input digital audio signal D_in, which may be a digital audio signal that was received over an I2S bus interface and dithered and/or interpolated. The input digital audio signal D_in may have, for example, a bit-depth of 24 bits, and is received at a noise shaper 11 and at a digital comparator 12. The noise shaper 11 performs noise shaping to reduce the bit-depth of the input digital audio signal D_in, for example, from 24 bits to 7 bits, and provides the noise shaped signal to a digital-to-analog converter (DAC) 15.

The comparator 12 compares the input digital audio signal Din to a threshold value, which may be zero but may instead be a non-zero threshold. When the input digital audio signal D_in is below the threshold, the comparator 12 asserts a mute control signal Mute_Ctrl at its output, but otherwise deasserts the mute control signal Mute_Ctrl.

The mute control signal Mute_Ctrl is received by an analog gain control ramp circuit 14, which generates a current reference I_GainControl that is provided to the DAC 15. The DAC 15 generates analog positive I_out+ and negative I_out− output currents from the digital noise shaped signal, with this operation being performed with a gain that is set as a function of the current reference I_GainControl.

An amplifier 16 receives the positive I_out+ and negative I_out− output currents, amplifies those currents, and drives an audio output device 27, such as a speaker, based thereupon.

Figure 3:
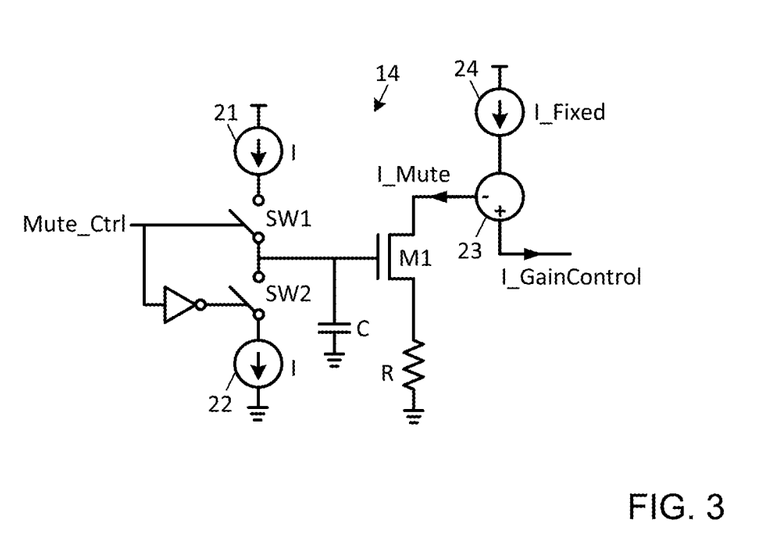
FIG. 3 is a schematic diagram of the analog gain control ramp circuit of FIG. 2.

The analog gain control ramp circuit 14, as shown in FIG. 3, includes a first switch SW1 connected between a current source 21 and a gate of an n-channel transistor M1, and a second switch SW2 connected between the gate of the n-channel transistor M1 and a current sink 22. The current I sourced by the current source 21 is equal to the current I sunk by the current sink 22. Switch SW1 is closed when the mute control signal Mute_Ctrl is asserted and otherwise open, while switch SW2 is conversely closed when the mute control signal Mute_Ctrl is deasserted and otherwise open. A capacitor C is connected between the gate of the n-channel transistor M1 and ground. The source of the n-channel transistor M1 is coupled to ground through a resistor R, and the drain of the n-channel transistor M1 is connected to a current subtractor circuit 23 to sink a mute current I_Mute therefrom. A current source 24 is connected to the current subtractor circuit 23 to source a fixed current I_Fixed thereto. The current subtractor circuit 23 functions to subtract the mute current I_Mute from the fixed current I_Fixed and output the result as the current reference I_GainControl used by the DAC 15.

In operation, in order to mute noise shaping without an audible pop, when the mute control signal Mute_Ctrl is de-asserted, switch SW2 closes and the current sink 22 sinks the current I from the capacitor C, thereby discharging the capacitor C and lowering the gate voltage of the n-channel transistor M1. Conversely, when the mute control signal Mute_Ctrl is asserted, switch SW1 closes and the current source 21 sources the current I to the capacitor C, raising the gate voltage of the n-channel transistor M1. As the gate voltage of the n-channel transistor M1 rises, the conductivity of the n-channel transistor M1 rises, and the magnitude of the mute current I_Mute sunk by the n-channel transistor M1 increases. As the magnitude of the mute current I_Mute increases, the current reference I_GainControl proportionally decreases. Since the gain of the DAC 15 is proportionally modified by the current reference I_GainControl, the gain of the DAC 15 decreases as the magnitude of the mute current I_Mute increases. When the magnitude of the mute current I_Mute reaches the magnitude of the fixed current I_Fixed, the gain of the DAC 15 falls to zero.

Stated differently, when the mute control signal Mute_Ctrl is asserted, the magnitude of the mute current I_Mute ramps upwardly according to a time constant set by the values of the capacitor C and the current I of the current source 21, and therefore current reference I_GainControl ramps downwardly according to that time constant. As such, when the mute control signal Mute_Ctrl is asserted, the gain of the DAC 15 quickly falls according to the time constant, and therefore the output of the amplifier 16 falls linearly according to the time constant, with the time constant not being so short that an audible pop occurs in playback but not being so long that muting is not performed quickly enough in response to D_in. The time constant may be set according to the type of noise shaper 11 utilized.

Figure 4:
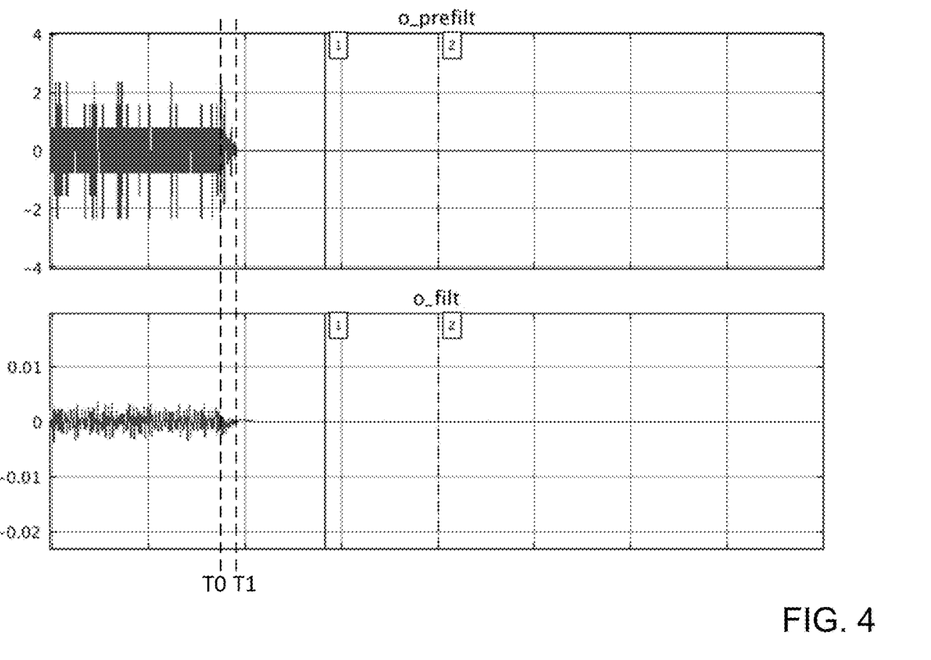
FIG. 4 graph showing operation of the digital audio playback circuit described herein when muting is performed.

This operation can be observed in FIG. 4, where at time T0, the signal output by the DAC 15, labelled as o_prefilt, begins to decrease in magnitude until it reaches a magnitude of zero at time T1. The signal after low pass filtering performed after amplification, labelled as o_filt, likewise and accordingly begins to decrease in magnitude at time T0 until it reaches a magnitude of zero at time T1. This ramping down in magnitude to zero may occur over a span of, for example, 200 μs.

Turn-on of the noise shaping works the same as turn-off of the noise shaping, only in reverse. For turn-on, instead of the gain being ramped down, the gain is ramped upward. When the mute control signal Mute_Ctrl is de-asserted, switch SW2 closes and the current sink 22 sinks the current I from the capacitor C, thereby discharging the capacitor C. As the capacitor C is discharged, the gate voltage of the n-channel transistor M1 falls. As the gate voltage of the n-channel transistor M1 falls, the conductivity of the n-channel transistor M1 falls, and the magnitude of the mute current I_Mute sunk by the n-channel transistor M1 decreases. As the magnitude of the mute current I_Mute decreases, the current reference I_GainControl proportionally increases. As a result, the gain of the DAC 15 increases as the magnitude of the mute current I_Mute decreases. When the magnitude of the mute current I_Mute reaches zero, the gain of the DAC 15 is at its maximum.

Figure 5:
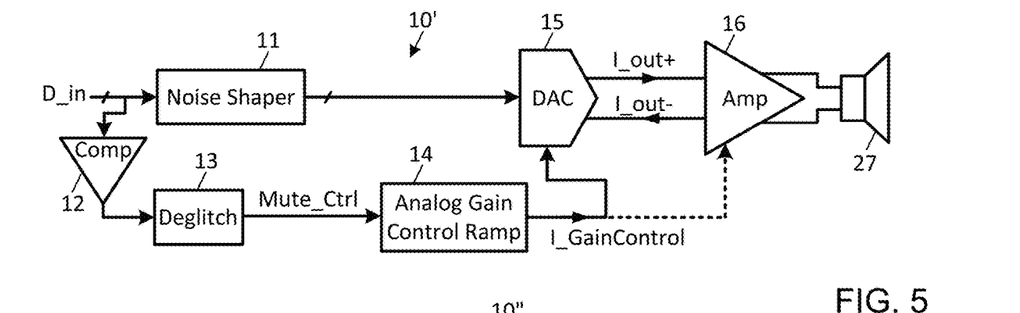
FIG. 5 is a block diagram of a first alternate configuration of the digital audio playback circuit described herein.

In the above-described digital audio playback circuit 10, the mute control signal Mute_Ctrl is generated by the comparator 12 and provided directly to the analog gain control ramp circuit 14. As another option, as shown in the digital audio playback circuit 10' of FIG. 5, the output of the comparator 12 may be provided to a deglitch circuit 13 which in turn generates the mute control signal Mute_Ctrl. The deglitch circuit 13 serves to filter out transients represented by the bits in D_in or transients in the D_in signal itself. In particular, the deglitch circuit 13 functions to assert the mute control signal Mute_Ctrl if D_in is below the threshold for a given period of time, and deasserts the mute control signal Mute_Ctrl if the mute control signal Mute_Ctrl is above the threshold for a given period of time. Depending on application, different thresholds may be used for rise and fall filtering—the deglitch circuit 13 can be arranged to assert the mute control signal Mute_Ctrl if D_in is below a first threshold for a first given period of time, and to deassert the mute control signal Mute_Ctrl if the mute control signal Mute_Ctrl is above a second threshold for a second given period of time; the first and second thresholds can be different, as can the first and second given periods of time.

Figure 6:
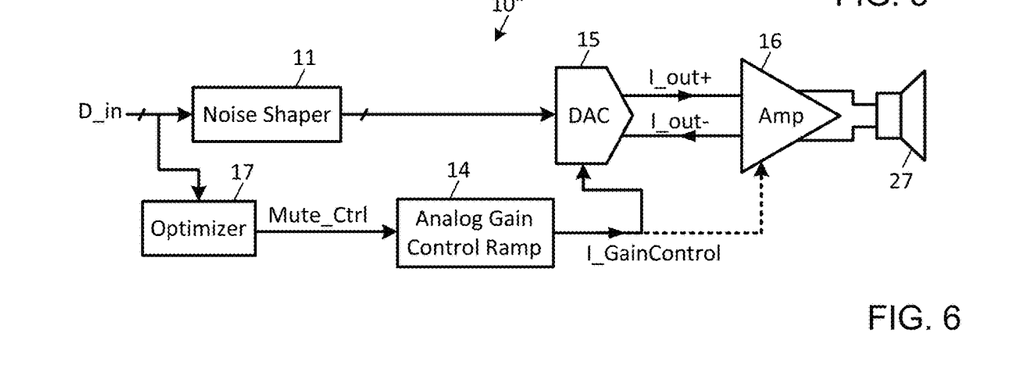
FIG. 6 is a block diagram of a second alternate configuration of the digital audio playback circuit described herein.

As another alternative shown in the digital audio playback circuit 10" of FIG. 6, the functionality of the comparator and deglitch circuit may be combined within one optimizer circuit 17, which may also provide further control of the DAC 15.

Figure 7:
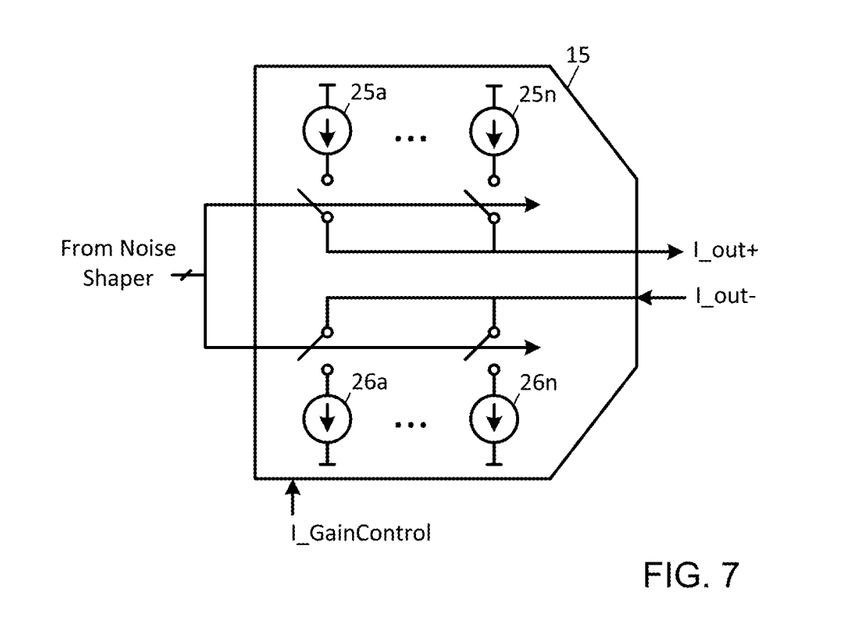
FIG. 7 is a schematic diagram of the digital to analog converter of FIG. 2.

An example implementation of the DAC 15 is now described with additional reference to FIG. 7. The DAC 15 may be any suitable type of DAC that has its gain controlled in an analog fashion to provide for smooth attenuation across a range down to a gain of zero, however, as an example, the illustrated DAC 15 is a current steering DAC that receives its digital input from the noise shaper 11. The DAC 15 provides differential current outputs generated by respective current sources 25*a* . . . 25*n* and current sinks 26*a* . . . 26*n* that are selectively connected to the differential inputs by switches based upon the digital input from the noise shaper 11, with n being, for example, 64. The currents sourced by the current sources 25*a* . . . 25*n* are equal to each other, and the currents sourced by the current sinks 26*a* . . . 26*n* are equal to one another and to the currents sourced by the current sources 25*a* . . . 25*n*. The current sources 25*a* . . . 25*n* and current sinks 26*a* . . . 26*n* are each referenced to the current reference I_GainControl. Stated differently, these currents are equally and each reduced in magnitude proportionally to the current reference I_GainControl—for example, if the current sources 25*a* . . . 25*n* source currents have a magnitude of Mag1 (in the case where the magnitude of the current reference I_GainControl is 0) and the current sinks 26*a* . . . 26*n* sink currents have a magnitude of Mag1 (in the case where the magnitude of the current reference I_GainControl is 0), and the magnitude of the current reference I_GainControl is Mag2, the resulting magnitude of the currents sourced by the current sources 25*a* . . . 25*n* and of the currents sunk by the current sinks 26*a* . . . 26*n* will be Mag1-Mag2.

Figure 8:
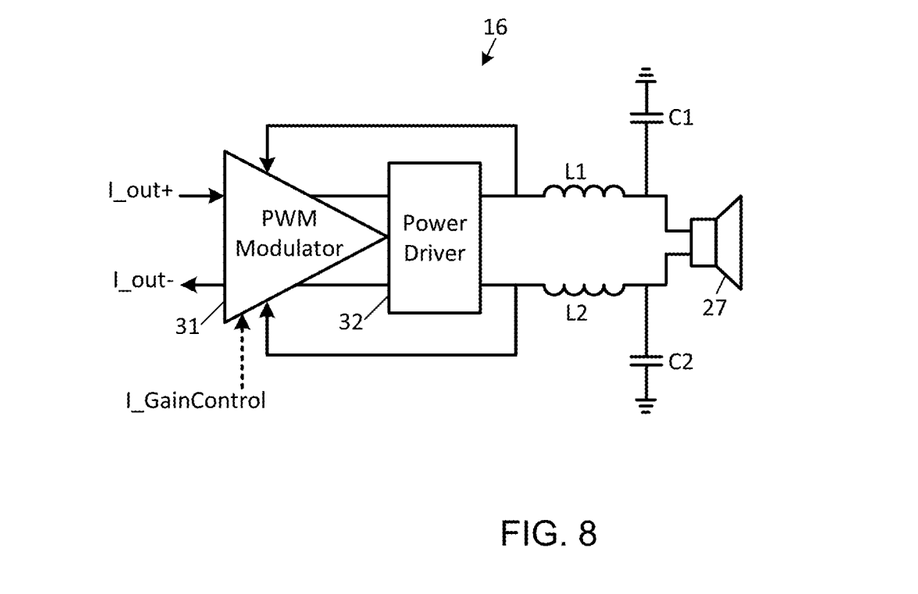
FIG. 8 is a schematic diagram of the amplifier of FIG. 2.

An example implementation of the amplifier 16 is now described with additional reference to FIG. 8. The amplifier 16 may be any amplifier suitable for audio output, however, as an example, the illustrated amplifier 16 is a class-D amplifier with a PWM modulator 31 receiving the positive and negative output currents I_out+ and I_out− from the DAC 15 and providing output to a power driver 32. Feedback to the PWM modulator 31 is taken at the output of the power driver 32, and an LC filter formed by inductors L1, L2 and capacitors C1, C2 is connected between the output of the power driver 32 and the audio output device 27.

In the above, the analog gain control I_GainControl is used to modify the gain of the DAC 15 so as to ramp down the DAC output upon muting to thereby reduce or eliminate pop. However, this analog gain control may instead be performed at the amplifier 16, in which case the gain of the amplifier 16 is ramped down proportionally based upon the analog gain control I_GainControl. In this case, the amplifier 16 may be any suitable type of audio output amplifier that has its gain controlled in an analog fashion to provide for smooth attenuation across a range down to a gain of zero.

In some instances, gain control of both the DAC 15 as described above, as well as gain control of the amplifier 16, may be performed. In this instance, the gain of both the DAC 15 and the amplifier 16 may be ramped down proportionally based upon the analog gain control I_GainControl. Indeed, the above may be generalized to utilize any components within a digital audio playback circuit that enable analog gain control to be performed to provide for smooth gain attenuation across a range down to a gain of zero.

Note that the above descriptions of ramping down the gain of the DAC 15 and/or the gain of the amplifier 16 upon muting are performed symmetrically upon de-muting. Thus, upon deassertion of the mute control signal Mute_Ctrl, the gain of the DAC 15 and/or the amplifier is ramped upwardly as a symmetric operation to the downward ramping described above.

There are many advantages over prior art devices provided by the digital audio playback circuits described herein. For example, the digital audio playback circuits described herein provide for a predetermined turn-off time for noise shaping, as opposed to prior art techniques that involve a varying turn-off time to help prevent damage. In addition, turn-off and turn-on of the noise shaping is symmetrical, eliminating another possible source of pop upon un-muting. Also, the digital operations remain unchanged, and the noise shaper is not stopped digitally because the muting is performed via the DAC and the ramping down.

It is clear that modifications and variations may be made to what has been described and illustrated herein, without thereby departing from the scope of this disclosure, as defined in the annexed claims.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A digital audio playback circuit, comprising:
   a noise shaping circuit configured to receive an input digital audio signal;
   a digital to analog converter (DAC) configured to convert the input digital audio signal to a pre-amplified output analog audio signal according to a gain ramp defined by a gain control signal;
   a muting circuit configured to compare input digital audio signal to a threshold and assert a mute control signal when the input digital audio signal is below the threshold;
   an analog gain control ramp circuit configured to generate the gain control signal in response to the mute control signal to cause the gain ramp to ramp down; and
   an amplifier configured to amplify the pre-amplified output analog audio signal for playback by an audio playback device.

2. The digital audio playback circuit of claim 1, wherein the ramping down of the gain ramp by the analog gain control ramp circuit yields a pre-determined turn-off time.

3. The digital audio playback circuit of claim 1, wherein the analog gain control ramp circuit is further configured to generate the gain control signal in response to deassertion of the mute control signal to cause the gain ramp to ramp upwardly.

4. The digital audio playback circuit of claim 1, wherein use of the DAC to convert the input digital audio signal to the pre-amplified output analog audio signal permits continued operation of the noise shaping circuit when the mute control signal is asserted.

5. The digital audio playback circuit of claim 1, wherein the analog gain control ramp circuit comprises:
   a transistor having a control terminal;
   a capacitor coupled between the control terminal of the transistor and ground;
   a current source selectively coupled to the control terminal of the transistor by a first switch in response to assertion of the mute control signal;
   a current sink selectively coupled to the control terminal of the transistor by a second switch in response to deassertion of the mute control signal; and
   a current subtractor configured to receive a fixed current and to subtract a mute current sunk by the transistor from the fixed current, based upon a voltage across the capacitor, to produce the gain control signal;
   wherein the current source charges the capacitor when the first switch is closed, and wherein the current sink discharges the capacitor when the second switch is closed.

6. The digital audio playback circuit of claim 1, wherein the DAC comprises a current steering DAC that selectively connects or disconnects current sources and current sinks to differential outputs in response to the input digital audio signal, the current sources and current sinks being referenced to the gain control signal.

7. The digital audio playback circuit of claim 1, wherein the amplifier comprises a class-D amplifier.

8. The digital audio playback circuit of claim 1, wherein the muting circuit comprises a comparator configured to compare the input digital audio signal to the threshold and to assert the mute control signal when the input digital audio signal is below the threshold.

9. The digital audio playback circuit of claim 1, wherein the muting circuit comprises:
   a comparator configured to compare the input digital audio signal to the threshold and to assert its output when the input digital audio signal is below the threshold; and
   a deglitch circuit configured to assert the mute control signal when the output of the comparator is asserted for at least a first threshold period of time, and to deassert the mute control signal when the output of the comparator is deasserted for at least a second threshold period of time.

10. The digital audio playback circuit of claim 1, wherein the input digital audio signal has been dithered and/or interpolated prior to receipt by the noise shaping circuit.

11. A method of digital audio playback circuit, comprising:
   receiving an input digital audio signal;
   performing noise shaping on the input digital audio signal;
   converting the input digital audio signal to a pre-amplified output analog audio signal according to a gain ramp defined by a gain control signal;
   comparing the input digital audio signal to a threshold and asserting a mute control signal when the input digital audio signal is below the threshold;
   generating the gain control signal in response to the mute control signal to cause the gain ramp to ramp down; and
   amplifying the pre-amplified output analog audio signal for playback by an audio playback device.

12. The method of claim 11, wherein comparing the input digital audio signal to a threshold and asserting the mute control signal when the input digital audio signal is below the threshold is performed by:
   comparing the input digital audio signal to the threshold and asserting a comparator output when the input digital audio signal is below the threshold; and
   asserting the mute control signal when the output of the comparator is asserted for at least a first threshold period of time, and deasserting the mute control signal when the output of the comparator is deasserted for at least a second threshold period of time.

13. The method of claim 11, wherein the input digital audio signal has been dithered and/or interpolated prior to receipt by the digital audio playback circuit.

14. A digital audio playback circuit, comprising:
   a noise shaping circuit receiving an input digital audio signal;
   a digital to analog converter (DAC) configured to convert the input digital audio signal to a pre-amplified output analog audio signal;
   an amplifier configured to amplify the pre-amplified output analog audio signal for playback by an audio playback device;

wherein the pre-amplified output analog audio signal is amplified by the DAC or the amplifier according to a gain ramp defined by a gain control signal;

a muting circuit configured to compare input digital audio signal to a threshold and assert a mute control signal when the input digital audio signal is below the threshold; and an analog gain control ramp circuit configured to generate the gain control signal based upon the mute control signal to cause the gain ramp to ramp down.

15. The digital audio playback circuit of claim 14, wherein the analog gain control ramp circuit comprises:

a transistor having a control terminal;

a capacitor coupled between the control terminal of the transistor and ground;

a current source selectively coupled to the control terminal of the transistor by a first switch in response to assertion of the mute control signal;

a current sink selectively coupled to the control terminal of the transistor by a second switch in response to deassertion of the mute control signal; and a current subtractor configured to receive a fixed current and to subtract a mute current sunk by the transistor from the fixed current, based upon a voltage across the capacitor, to produce the gain control signal;

wherein the current source serves to charge the capacitor when the first switch is closed, and wherein the current sink serves to discharge the capacitor when the second switch is closed.

16. The digital audio playback circuit of claim 15, wherein the DAC comprises a current steering DAC that selectively connects or disconnects current sources and current sinks to differential outputs in response to the input digital audio signal, the current sources and current sinks being referenced to the gain control signal.

17. The digital audio playback circuit of claim 15, wherein the amplifier comprises a class-D amplifier that has a gain matching the gain ramp defined by the gain control signal.

18. The digital audio playback circuit of claim 15, wherein the muting circuit comprises a comparator configured to compare the input digital audio signal to the threshold and to assert the mute control signal when the input digital audio signal is below the threshold.

19. The digital audio playback circuit of claim 15, wherein the muting circuit comprises:

a comparator configured to compare the input digital audio signal to the threshold and to assert its output when the input digital audio signal is below the threshold; and a deglitch circuit configured to assert the mute control signal when the output of the comparator is asserted for at least a first threshold period of time, and to deassert the mute control signal when the output of the comparator is deasserted for at least a second threshold period of time.

20. The digital audio playback circuit of claim 15, wherein the input digital audio signal has been dithered and/or interpolated prior to receipt by the noise shaping circuit.

* * * * *

UNITED STATES PATENT AND TRADEMARK OFFICE
CERTIFICATE OF CORRECTION

| | | |
|---|---|---|
| PATENT NO. | : 11,804,814 B1 | Page 1 of 1 |
| APPLICATION NO. | : 17/719613 | |
| DATED | : October 31, 2023 | |
| INVENTOR(S) | : Francesco Stilgenbauer et al. | |

It is certified that error appears in the above-identified patent and that said Letters Patent is hereby corrected as shown below:

In the Specification

At Column 4, Line 4, please replace the term [[ Din ]] with -- $D\_in$ --.

Signed and Sealed this
Fourth Day of March, 2025

Coke Morgan Stewart
*Acting Director of the United States Patent and Trademark Office*